(12) United States Patent
Liu et al.

(10) Patent No.: US 8,063,472 B2
(45) Date of Patent: Nov. 22, 2011

(54) SEMICONDUCTOR PACKAGE WITH STACKED DICE FOR A BUCK CONVERTER

(75) Inventors: Yong Liu, Scarborough, ME (US); William Newberry, Standish, ME (US); Margie T. Rios, Mandaue (PH); Qiuxiao Qian, Suzhou (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 849 days.

(21) Appl. No.: 12/020,855

(22) Filed: Jan. 28, 2008

(65) Prior Publication Data

US 2009/0189266 A1 Jul. 30, 2009

(51) Int. Cl.
*H01L 23/495* (2006.01)
(52) U.S. Cl. ............... 257/676; 257/E23.052; 438/109
(58) Field of Classification Search ........... 257/676, 257/E23.052
See application file for complete search history.

(56) References Cited

U.S. PATENT DOCUMENTS

| | | | |
|---|---|---|---|
| 6,777,786 B2 | 8/2004 | Estacio | |
| 6,806,580 B2 * | 10/2004 | Joshi et al. | 257/777 |
| 7,029,947 B2 | 4/2006 | Joshi | |
| 7,154,186 B2 | 12/2006 | Noquil et al. | |
| 7,663,211 B2 * | 2/2010 | Noquil et al. | 257/675 |
| 7,675,148 B2 * | 3/2010 | Lim et al. | 257/676 |
| 7,750,445 B2 * | 7/2010 | Liu et al. | 257/675 |
| 2005/0218489 A1 * | 10/2005 | Satou et al. | 257/678 |
| 2005/0275082 A1 * | 12/2005 | Ferrara et al. | 257/691 |
| 2007/0161151 A1 * | 7/2007 | Madrid et al. | 438/106 |
| 2007/0249092 A1 * | 10/2007 | Joshi et al. | 438/107 |
| 2010/0059875 A1 * | 3/2010 | Sato et al. | 257/690 |

* cited by examiner

*Primary Examiner* — Benjamin Sandvik
(74) *Attorney, Agent, or Firm* — Hiscock & Barclay, LLP

(57) ABSTRACT

Disclosed in this specification is a buck converter package with stacked dice and a process for forming a buck converter. The package includes a die attach pad with a low side die mounted on one surface and a high side die mounted on the opposing surface. The die attach pad is conductive, such that the drain of the low side die is connected to the source of the high side die through the pad. A controller die controls the gates of the high and low side dies. A plurality of leads extends outside of the package to permit electrical connections to the inside of the package. The high side drain is exposed to one of the surfaces of the package.

18 Claims, 9 Drawing Sheets

SEMICONDUCTOR PACKAGE WITH STACKED DICE FOR A BUCK CONVERTER

FIELD OF THE INVENTION

This invention relates, in one embodiment, to a flip leaded molded package (FLMP) with stacked dice for a buck converter and a process for forming the same. The buck converter is encased within a molding compound such that leads extend from the internal components to the outside of the package. The drain of the high side die is exposed to an external surface of the package. The source of the high side drain is electrically connected to the drain of the low side die through a conductive die attach pad.

BACKGROUND OF THE INVENTION

Buck converters are conventionally used to convert an input voltage to a lower, output voltage. A synchronous buck converter uses a high side die (which is coupled to the input voltage) and a low side die (which is coupled to ground) connected in series. The operation of the high side and low side dies is controlled by a controller die. The controller die operates the high side and low side gates to produce the desired duty cycles. By activating the high side die for a specified amount of time and thereafter deactivating the high side die (the deactivation of which is assisted by opening the low side die) a downgraded voltage is produced.

Unfortunately, prior art buck converters require a relatively large footprint. Therefore, a buck converter package is desired that has a substantially smaller footprint (for example, for portable applications). Additionally, prior art buck converters require extensive wirebonding and involve complex electrical paths which result in larger parasitic capacitances and inductances. A buck converter package with simpler electrical circuitry and stacked dice which has a smaller footprint and better electrical performance is also desired.

SUMMARY OF THE INVENTION

The invention comprises, in one form thereof, a buck converter package with a conductive central die attach pad disposed within a molding compound. A low side die contacts one surface of the die attach pad such that the low side drain makes an electrical contact with the die attach pad. A high side die mounted on the opposite surface of the die attach pad such that the high side source makes an electrical contact with the die attach pad. A controller die is disposed within the molding compound for controlling the high and low side dies. The drain of the high side die extends outside of the surface of the molding compound and may be connected to external circuitry. A plurality of leads also extends outside of the molding compound for making connections to other external circuits.

An advantage of the present invention is the large surface area of the high side drain that is available to conduct heat. Such a stacked dice configuration both reduces the footprint of the device and helps to dissipate any heat that may be produced by the package during operation. Another advantage of the present invention is that it can reduce the parasitic capacitances and inductances due to both low side die (drain) and high side die (source) sharing the same die attach pad. The reduction of the parasitic capacitances and inductances also reduces the switching losses of the buck converter, and enables the use of higher switching frequencies. Such a reduction further reduces losses and improves power-conversion efficiency.

BRIEF DESCRIPTION OF THE DRAWINGS

The present invention is disclosed with reference to the accompanying drawings, wherein.

Corresponding reference characters indicate corresponding parts throughout the several views. The examples set out herein illustrate several embodiments of the invention but should not be construed as limiting the scope of the invention in any manner.

DETAILED DESCRIPTION OF A PREFERRED EMBODIMENT

Figure 1A:
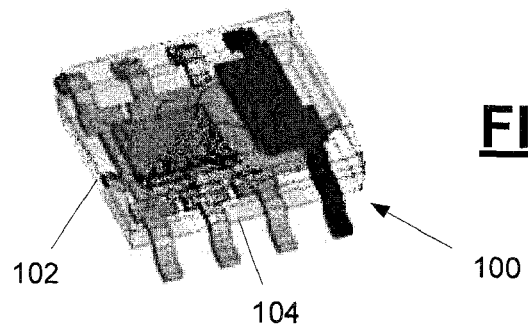
FIG. 1A is a perspective view of one embodiment of the invention with the molding compound shown in transparency.

Referring to FIG. 1A, buck converter package 100 is shown enclosed in molding compound 102. For the sake of illustration, molding compound 102 has been shown in phantom. The assembly 104 is disposed within molding compound 102 and is shown in more detail in FIG. 1B.

Figure 1B:
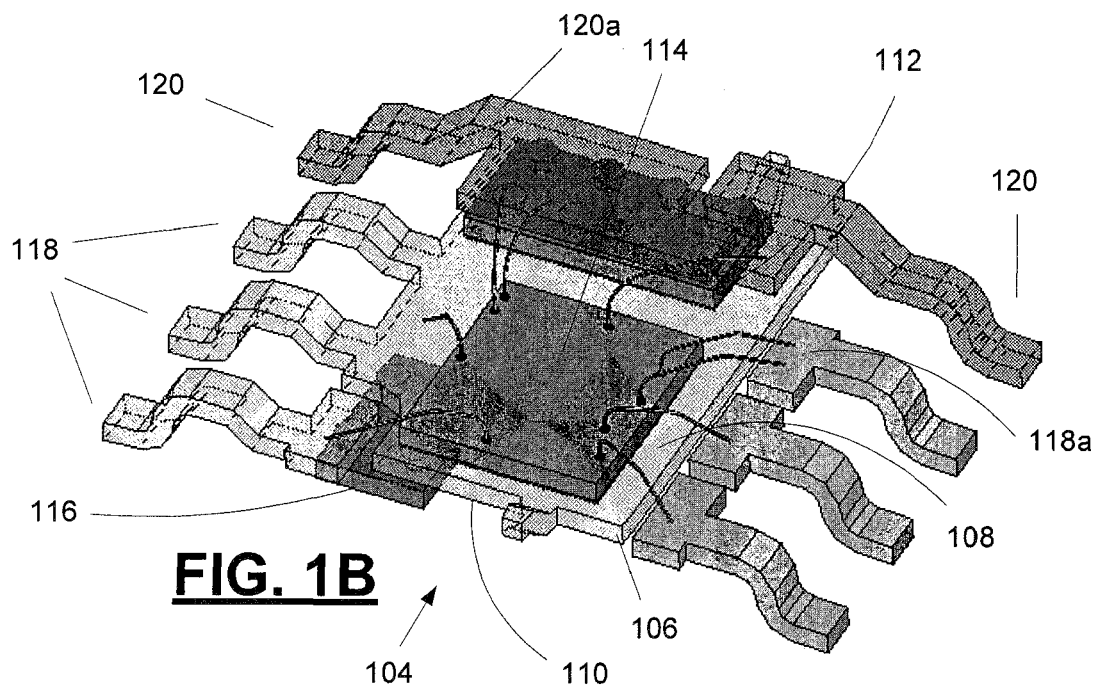
FIG. 1B is a perspective view of the internal components of FIG. 1A.

Referring now to FIG. 1B, assembly 104 is comprised of conductive die attach pad 106, which has a first surface 108 and a second surface 110, opposite first surface 108. Low side die 112 and controller die 114 are mounted on first surface 108. High side die 116 is mounted on second surface 110 of die attach pad 106. As will be described in detail elsewhere in this application, low side die 112 is a flip chip die with its drain placed in electrical communication with the source of high side die 116 through conductive die attach pad 106. High side die 116 is also a flip chip die. Electrical connections are made between the components of the assembly 104 and the environment outside of the molding compound 102 (see FIG. 1A) through leads 118 and 120. The assembly 104 has a first plurality of leads 118 and a second plurality of leads 120. The first plurality of leads 118 attach to the assembly 104 through connections 118a. In contrast, the second plurality of leads 120 attach to the assembly 104 through connectors 120a which are not coplanar with respect to the plane of the pad 106. When assembly 104 is enclosed within molding compound 102, the drain of the high side die 116 is left exposed to the environment, thus allowing an electrical connection to the drain of die 116. Such a configuration is shown in FIG. 1C.

Figure 1C:
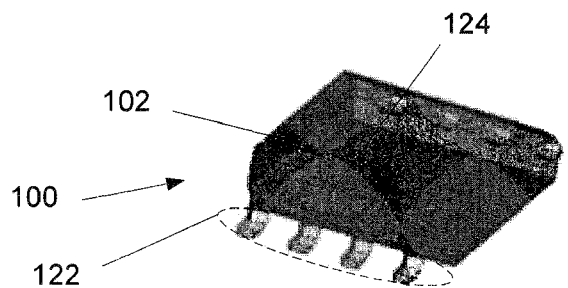
FIG. 1C is a bottom view of the package of FIG. 1A.

As shown in FIG. 1C, when the assembly 104 is enclosed within molding compound 102, a portion 122 of the first and second plurality of connections (118 and 120) is left exposed to the environment, thus permitting electrical connections to be made to the internal components of package 100. The bottom surface 124 of high side die 116 is also exposed to the environment. The exposed surface area of bottom surface 124 is large, relative to the exposed surface area of any other individual lead (118 and 120). A method for manufacturing package 100 is shown in FIG. 2.

Figure 2:
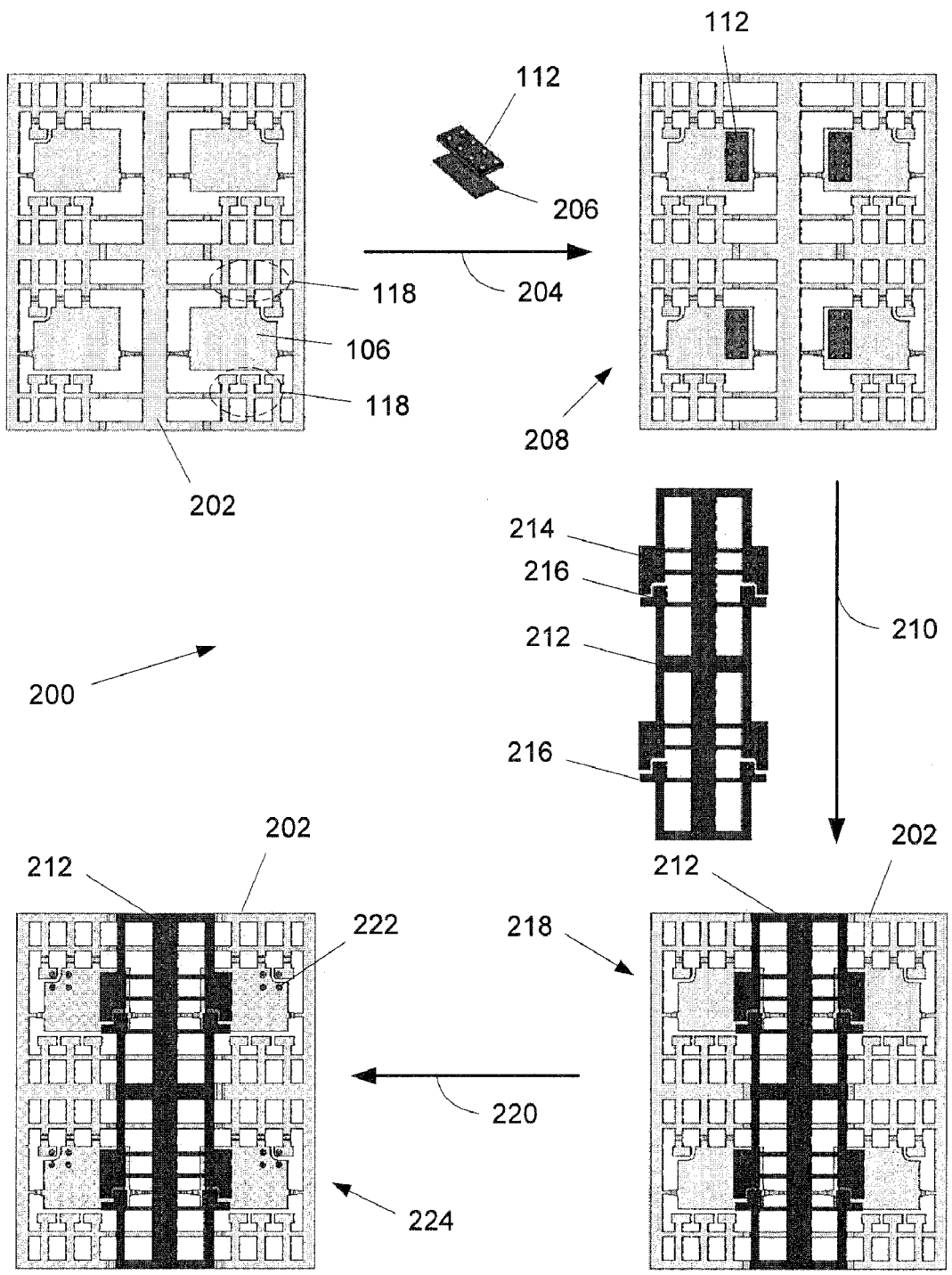
FIG. 2 is a flow diagram of one process of the invention for forming the embodiment shown in FIG. 1A.

FIG. 2 depicts process 200 for forming a buck converter. Process 200 begins with first lead frame 202. First lead frame 202 may be made of any suitable conductive compound. For example, the lead frame 202 may be made of copper. The lead frame may be plated with one or more layers of other conductive metals and metal alloys, such as nickel, palladium, and the like. First lead frame 202 has a plurality of die attach pads 106 which are connected to the frame 202 by a first plurality of connections 118. In step 204, low side die 112 is mounted to first surface 108 of the die attach pad 106 with conductive adhesive 206, forming assembly 208. For example, conductive adhesive 206 may be any suitable solder or conductive epoxy. In assembly 208 the surface of die attach pad 106 is contiguous with the drain of low side die 112. The exposed surface of low side die 112 includes a plurality of bumps. These bumps include low side source bumps and low side gate bumps. Step 204 may be performed, for example, by a soft solder wire process.

In step 210 of process 200, second lead frame 212 is attached to low side die 112 of assembly 208. Second lead frame 212 includes conductive adhesive configured to mate with the corresponding source and gate bumps on the exposed surface of low side die 112. Such conductive adhesive may be deposited by, for example, screen printing. Second lead frame 212 is attached such that low side source lead 214 is adhesively connected to the low side source of die 112 with the conductive bumps. Similarly, low side gate lead 216 is attached so that it is adhesively connected to low side gate of die 112. The resulting assembly 218 has low side die 112 disposed between first lead frame 202 and second lead frame 212.

In step 220 of process 200 conductive, adhesives 222 are attached to the second surface 110 (see FIG. 1B) of die attach pad 106. In the embodiment depicted as assembly 224, first lead frame 202 is shown as being transparent to better illustrate adhesive 222 being disposed on the undersurface 110. Adhesives 222 are disposed on undersurface 110 to permits selective connections to be formed to the gate and source of the high side die (see FIG. 3). The remaining steps of process 200 are depicted in FIG. 3.

Figure 3:
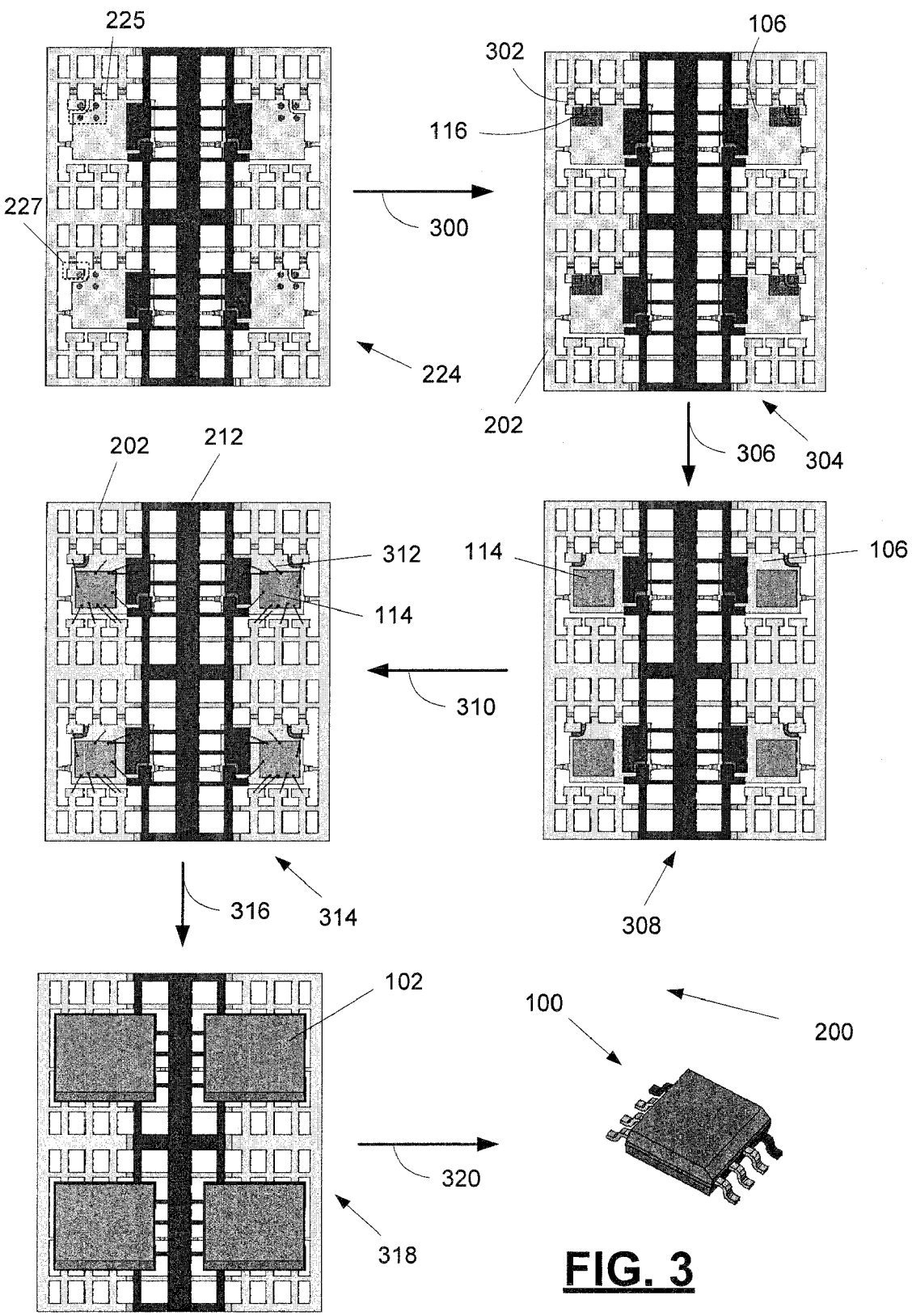
FIG. 3 is a continuation of the flow diagram of FIG. 2.

FIG. 3 illustrates additional steps of process 200 for producing buck converter package 100. In step 300 high side die 116 is attached to the second surface 110 of die attach pad 106 using adhesives 222, forming assembly 304. In step 300, source adhesives 225 will be connected to the source bumps of high side die 116, thus forming a connection between the source of die 116 and the die attach pad 106. The adhesive on gate 227 will be connected to the gate bump of high side die 116, thus forming a connection between the gate of die 116 and the gate lead 302.

In step 306 of process 200, shown in FIG. 3, controller die 114 is adhesively attached to the first surface 108 (see FIG. 1B) of die attach pad 106, forming assembly 308. Controller die 114 is mounted to the first surface 108 of die attach pad 106 with non-conductive adhesive, thus the bottom of die 114 does not make an electrical connection to pad 106. In step 310 the controller die 114 is attached to the leads of first lead frame 202 and second lead frame 212 by wirebonds 312, forming assembly 314.

In step 316, molding compound 102 is used to partially enclose assembly 314, forming assembly 318. Molding compound 102 may be any suitable thermosetting materials. Conventionally, polymeric resins are used, but any suitable material may be employed. The molding compound 102 encloses the controller die 114, the low side die 112, the die attach pad 106, a portion of the high side die 116 such that the high side drain is exposed (see surface 124 of FIG. 1C), and a portion of the plurality of leads (see portion 222 of FIG. 1C) such that the leads extend outside of the molding compound 102.

In step 320 end-of-line processes, such as singulation operations and deformations of the leads, are performed thereby producing package 100. The details of the wirebonding layout of one package of the invention are shown in FIG. 4.

Figure 4:
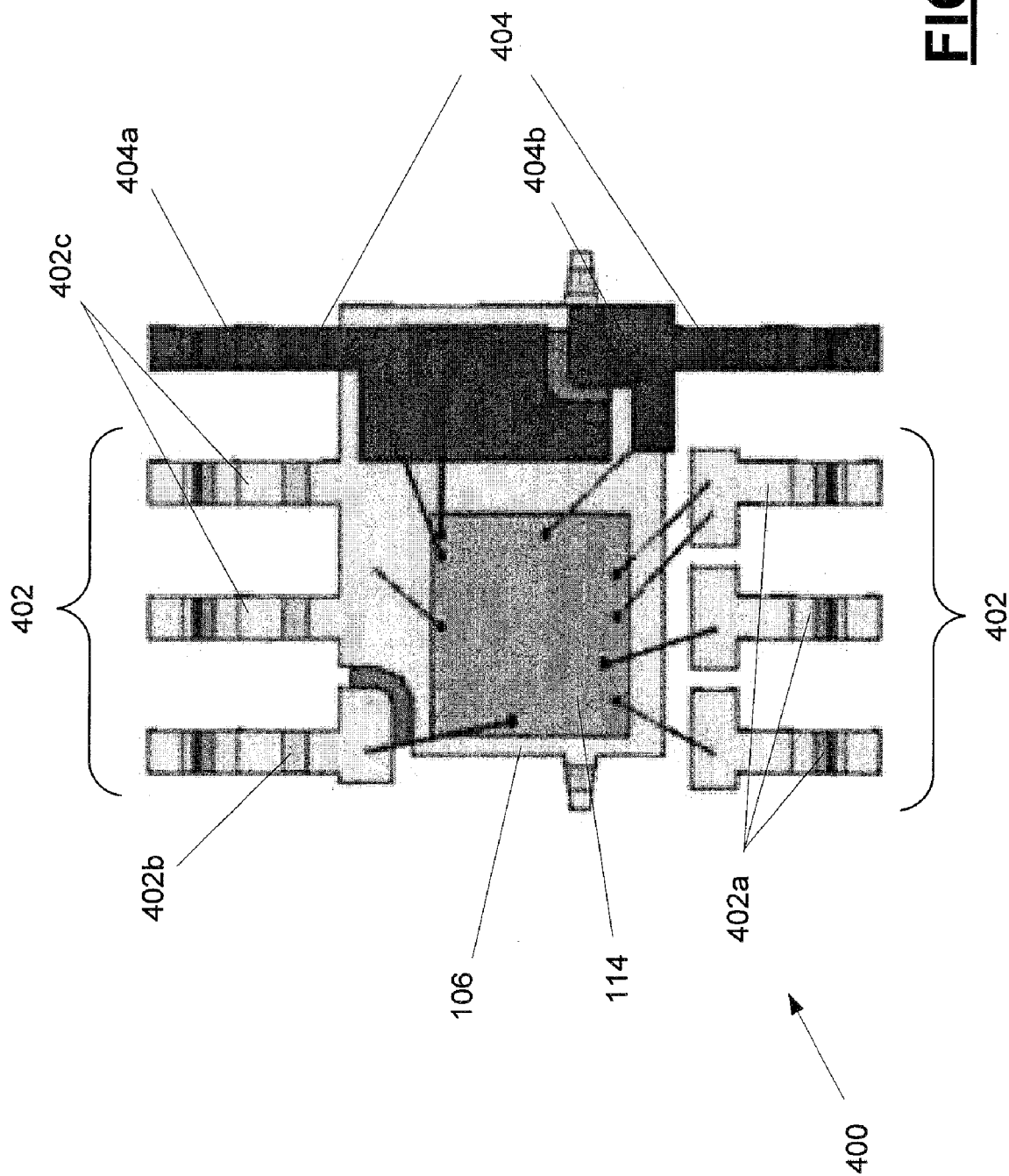
FIG. 4 is a top view of the internal components of the package of FIG. 1 showing the electrical connections.

FIG. 4 shows the electrical connections of one assembly 400. Assembly 400 has a first plurality of leads 402 (formed from first lead frame 202 of FIG. 2) and a second plurality of leads 404 (formed from second lead frame 212 of FIG. 2). In contrast, leads 404 are disposed in a plane above (i.e. not co-planar with) die attach pad 106.

Controller die 114 is mounted on first surface 108 of die attach pad 106 with non-conductive adhesive. Die 114 is wirebonded to controller leads 402a, to high side gate lead 402b, and to die attach pad 106 (and thereby to die attach pad leads 402c). Controller die 114 is also wirebonded to low side source lead 404a and the low side gate lead 404b. In the embodiment shown in FIG. 4, die attach pad leads 402c function as both the high side source lead and the low side drain lead, since the die attach pad 106 is in electrical contact with the source of the high side die 116 and the drain of low side die 112.

Low side die 112 is mounted on first surface 108 of die attach pad 106 with conductive adhesive such that the drain of die 112 contacts pad 106. The source of low side die 112 is adhesively connected to source lead 404a, which is part of the second lead frame 212. The gate of low side die 112 is adhesively connected to low side gate lead 404b. The wirebond connecting the lead 404b to the controller die 114 permits the controller die 114 to control the operation of low side die 112.

High side die 116 is mounted on second surface 110 of die attach pad 106 with conductive adhesive such that the source of die 116 contacts pad 106. The drain of die 116 remains exposed to the external environment when the assembly is encased in molding compound 102 (see FIG. 1C). During use, the drain of die 116 is attached to a conductive surface, such as a circuit board.

Figure 5:
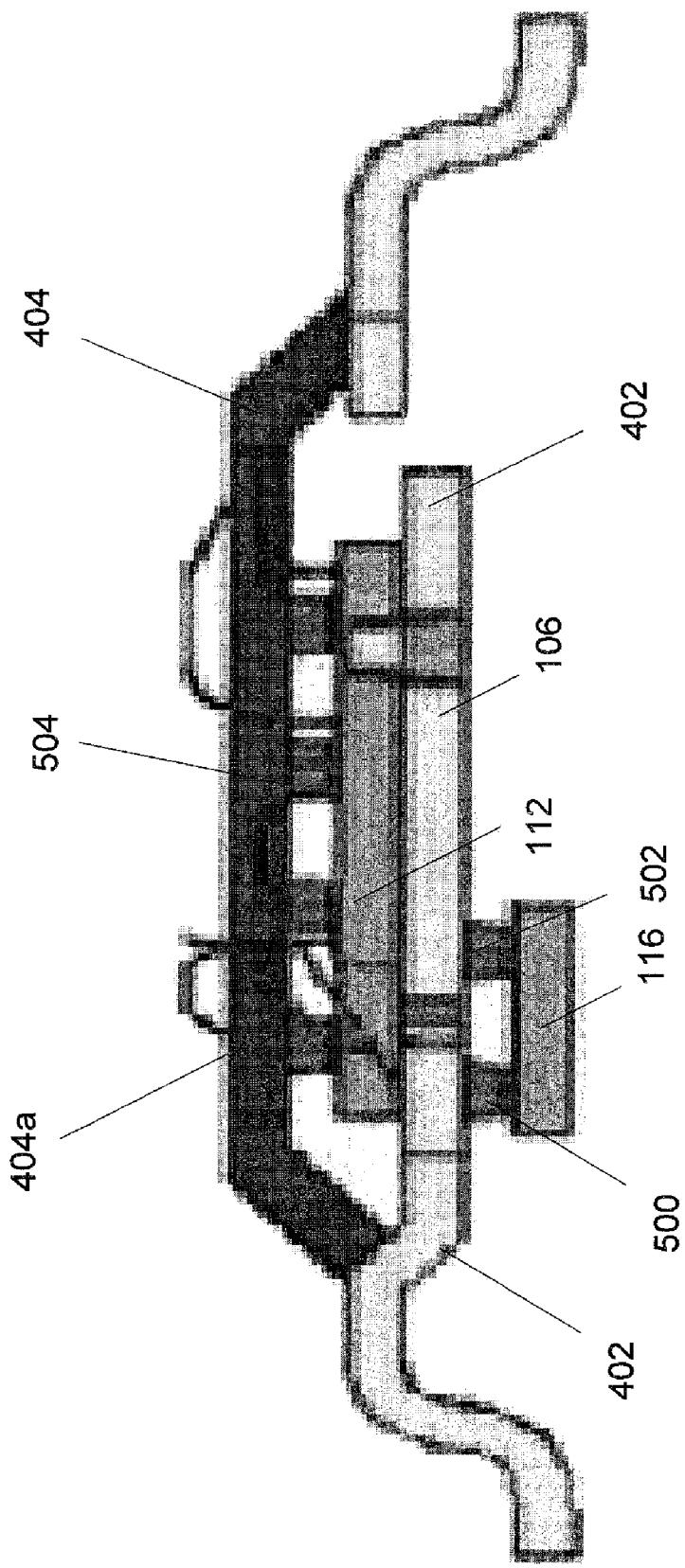
FIG. 5 is a side view of the internal components of FIG. 4.

FIG. 5 illustrates the lack of coplanarity of the leads 404 formed from the second lead frame with respect to the die attach pad 106. For example, low die source lead 404a is not coplanar with die attach pad 106. In the embodiment depicted in FIG. 5, the source lead 404a is adhesively attached to low side source by conductive bumps 504. Likewise, the gate of high side die 116 is adhesively attached to the high side gate lead by bump 500. The high side source is connected to the high side source lead by conductive bumps 502.

Figure 5A:
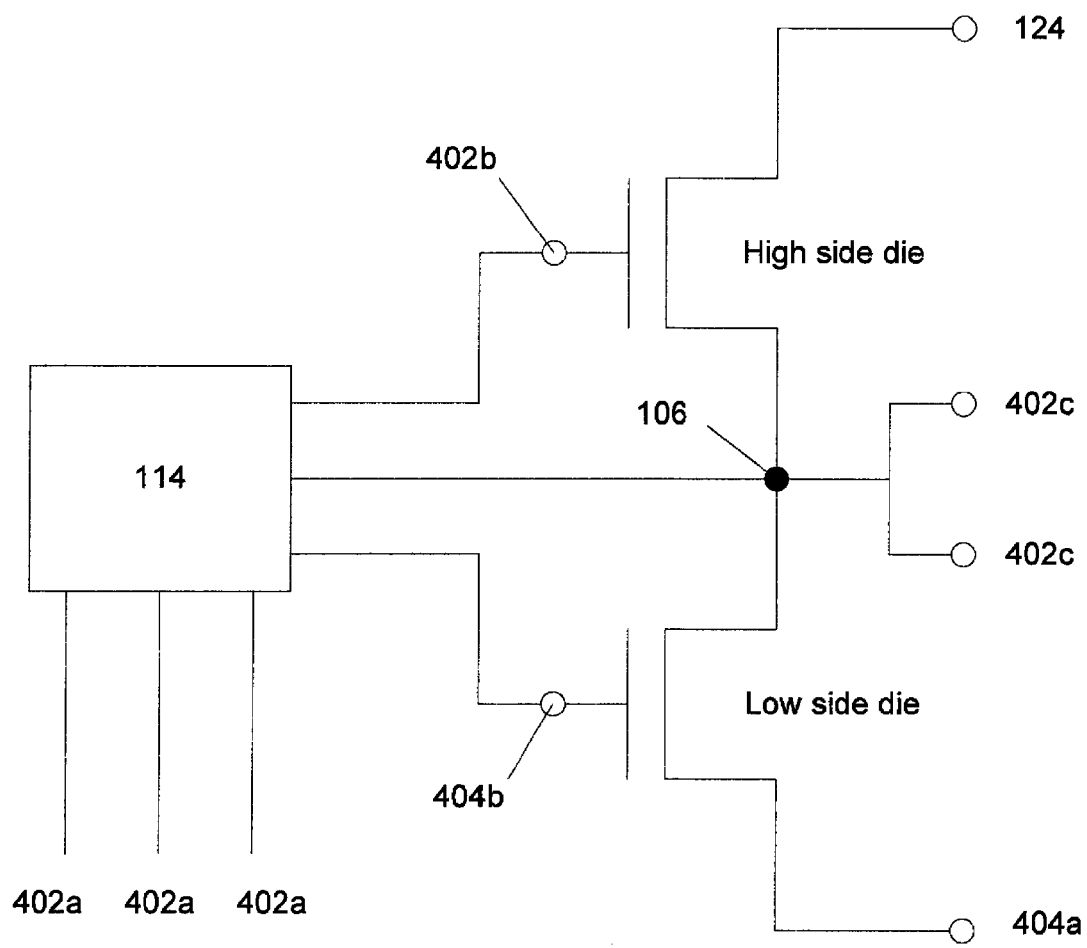
FIG. 5A is a schematic diagram of the package of FIG. 5.

FIG. 5A is a schematic diagram of the electrical circuit of the embodiment shown in FIG. 5. FIG. 5A shows the source of high side die 116 is electrically connected to the drain of low side die 112. The drain of high side die 116 is connected to bottom surface 124. The source of low side die 116 is connected to lead 404a.

Figure 6A:
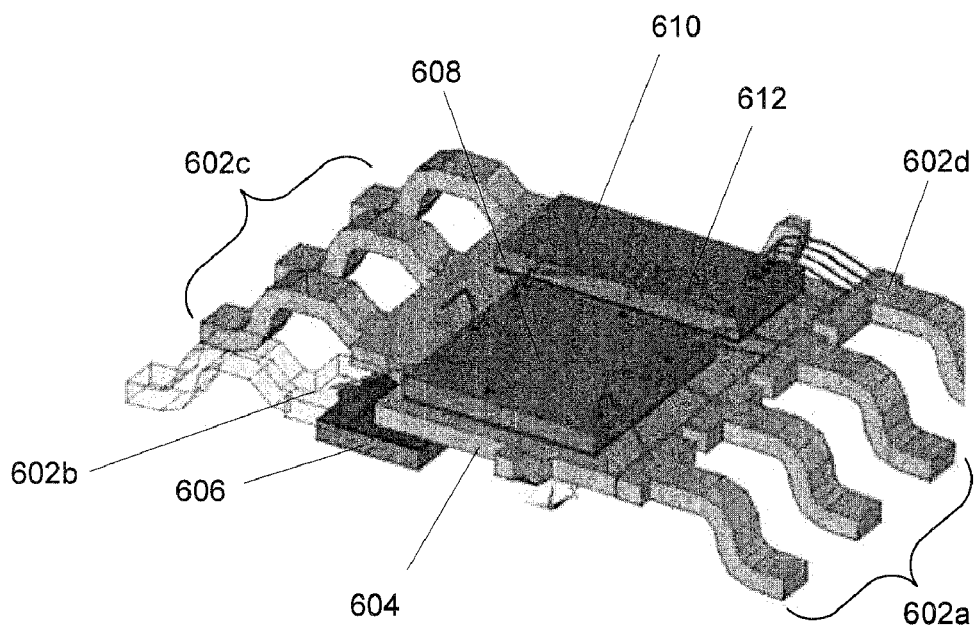
FIG. 6A is a perspective view of another embodiment of the invention.
Figure 6B:
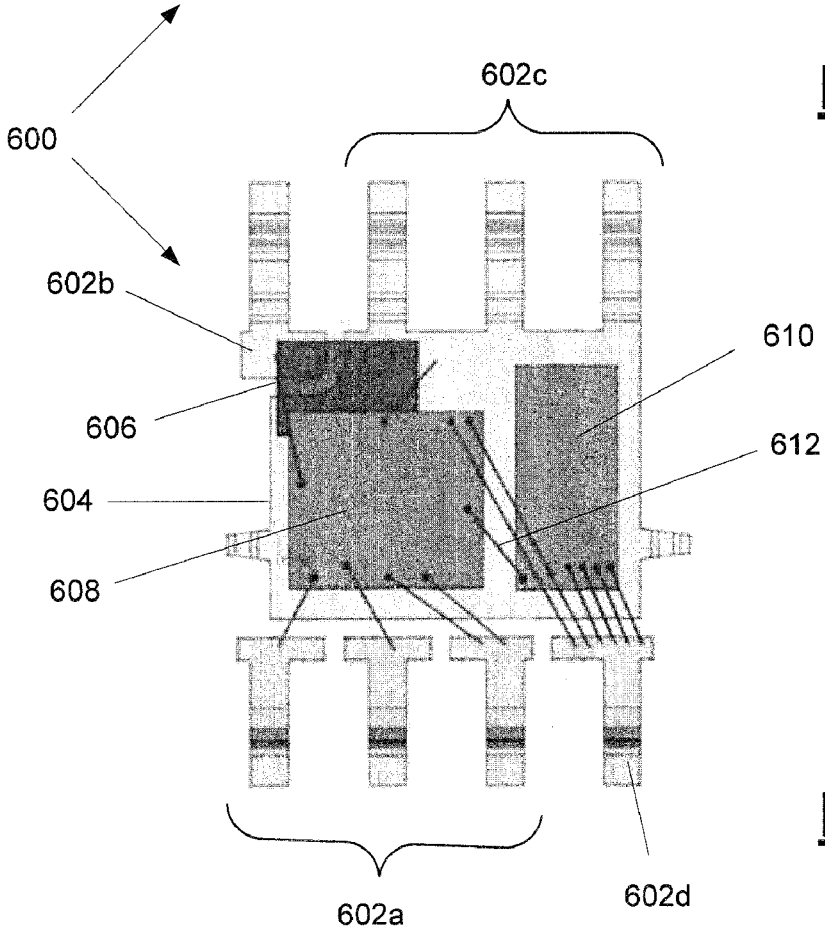
FIG. 6B is a top view of the embodiment shown in FIG. 6A.

FIG. 6A and FIG. 6B are depictions of another embodiment of the invention, wherein the electrical connections differ from the electrical connections of the first embodiment. Unlike assembly 400 of FIG. 4, assembly 600 of FIG. 6 lacks a second lead frame. Such a second lead frame may be omitted by supplying wirebonding connections. In the embodiment depicted in FIG. 6, assembly 600 includes controller die 608 and low side die 610, both of which are mounted on die attach pad 604. Controller die 608 is mounted using non-conductive adhesive, whereas low side die 610 is mounted using conductive adhesive such that the drain of low side die 610 is in electrical contact with pad 604. Bump contacts are not necessary for such a connection, as the entire surface of the low side drain is contiguous with die attach pad 604.

Controller die 608 is wirebonded to controller leads 602a. Controller die 608 is also wirebonded to high side gate lead 602b, which is in electrical communication with the high side gate. Controller die 608 is also wirebonded to the die attach pad 604. Since the die attach pad 604 is in electrical communication with the drain of the low side die 610 and the source of the high side die 606, such wirebonding causes die attach pad leads 602c to function as both the high side source lead and the low side drain lead. Controller die 608 is wirebonded to low side source lead 602d. Unlike the first embodiment, the controller die 608 is wirebonded to the gate of low side die 610 with wirebond 612.

The gate of low side die 610 is controlled by controller die 608 through wirebond 612. The source of low side die 610 is wirebonded to source lead 602d. The drain of low side die 610 is electrically connected to die attach pad 604 with a conductive adhesive. The configuration of high side die 606 is substantially similar to the configuration of high side die 116 previously discussed.

Figure 7:
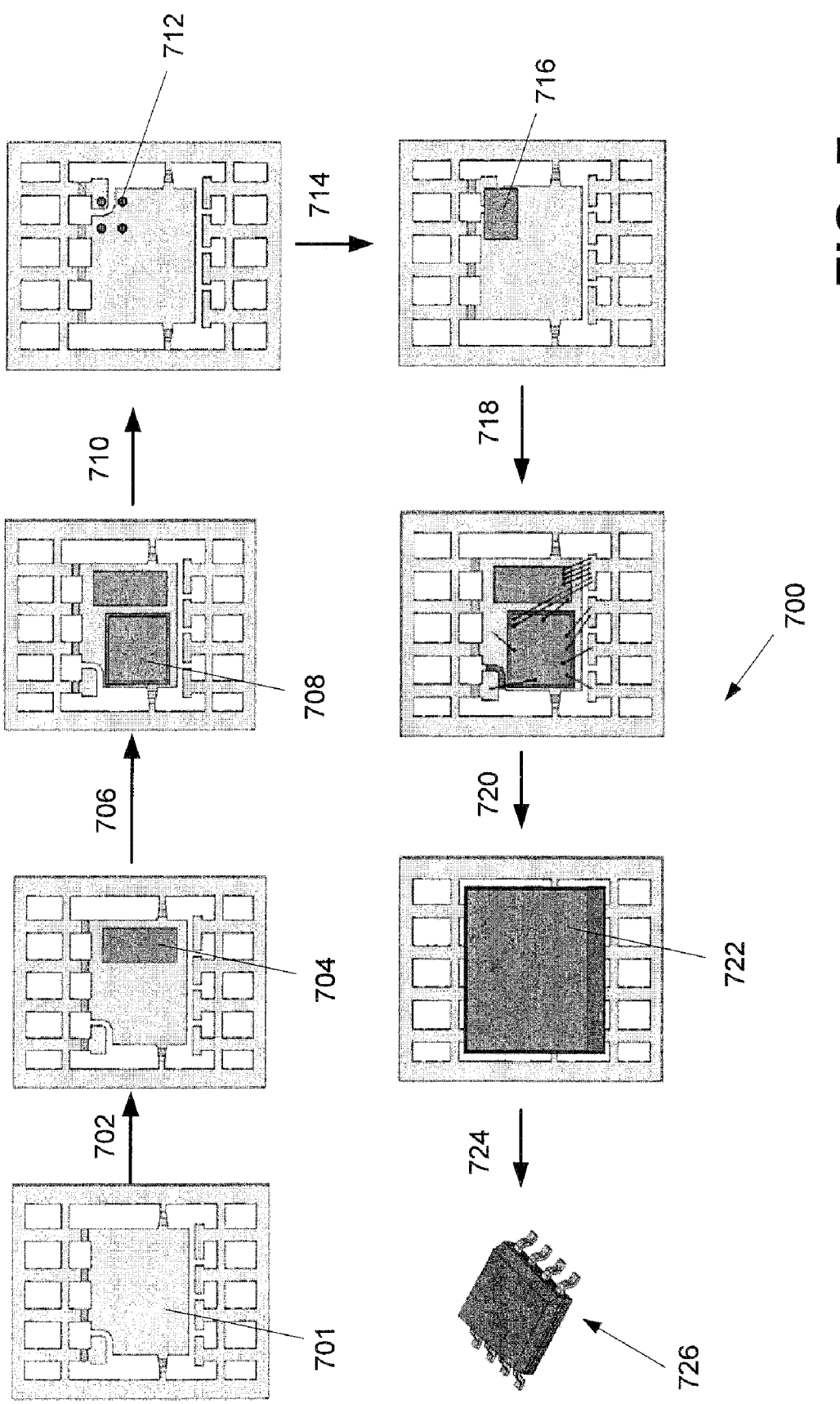
FIG. 7 is a flow diagram of another process of the invention for forming the embodiment of FIG. 6A.

FIG. 7 is a depiction of a process 700 for forming a buck converter package 726 that includes the features of the assembly 600 of FIG. 6. In step 702 of process 700, low side die 704 is attached to a first surface of die attach pad 701 with a conductive adhesive such that the drain of die 704 is in electrical contact with pad 701. In step 706, controller die 708 is attached to the same first surface of pad 701 with non-conductive adhesive. In step 710, conductive adhesives 712 are disposed on the second surface of pad 701. These conductive adhesives 712 are used in step 714 to mount high side die 716 to the second surface of die attach pad 701. In step 718 wirebonds are made on the first surface of die attach pad 701 as previously described. In step 720 molding compound 722 encloses the controller die 708, the low side die 704, the die attach pad 701, a portion of the high side die 716 such that the high side drain is exposed, and a portion of the plurality of leads such that the leads extend outside of the molding compound 722. In step 724, end-of-line processes are performed which result in package 726. Examples of end-of-line processes include cutting of the lead frame and deformation of the leads into a desired shape.

Figure 8A:
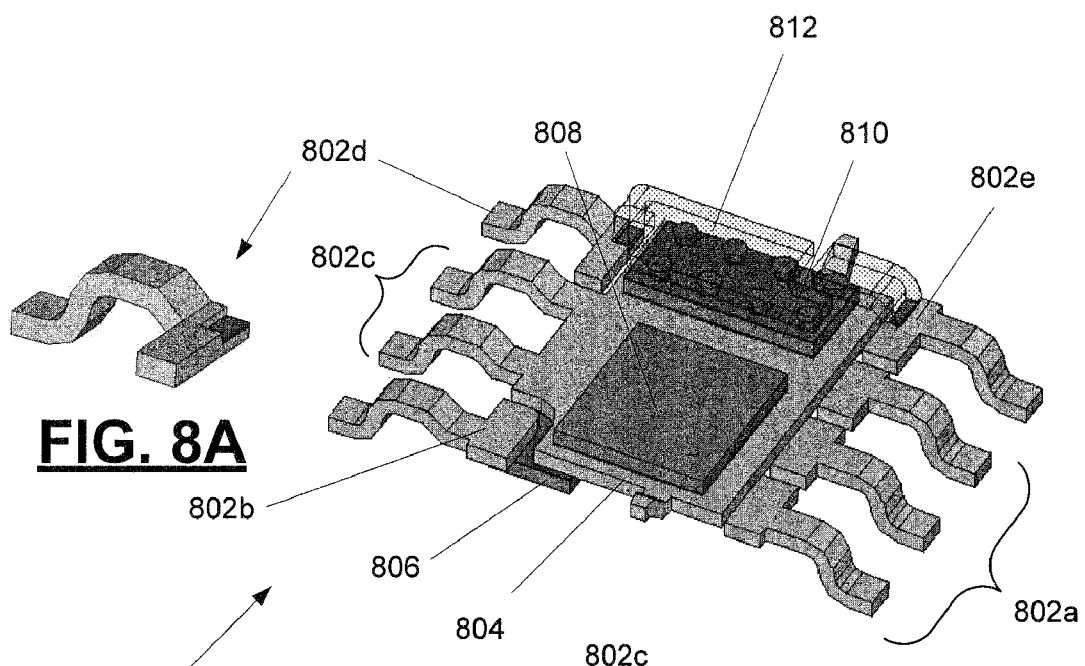
FIG. 8A is a perspective view of yet another embodiment of the invention.

FIG. 8 is a depiction of a third embodiment of the invention, wherein the electrical connections differ from the electrical connections of the first and second embodiments. Assembly 800 includes low side die 810 and controller die 808, both of which are attached to the first surface of die attach pad 804. Controller die 808 is attached with non-conductive adhesive, whereas low side die 810 is attached with conductive adhesive such that the drain of die 810 is in electrical contact with pad 804.

Figure 8B:
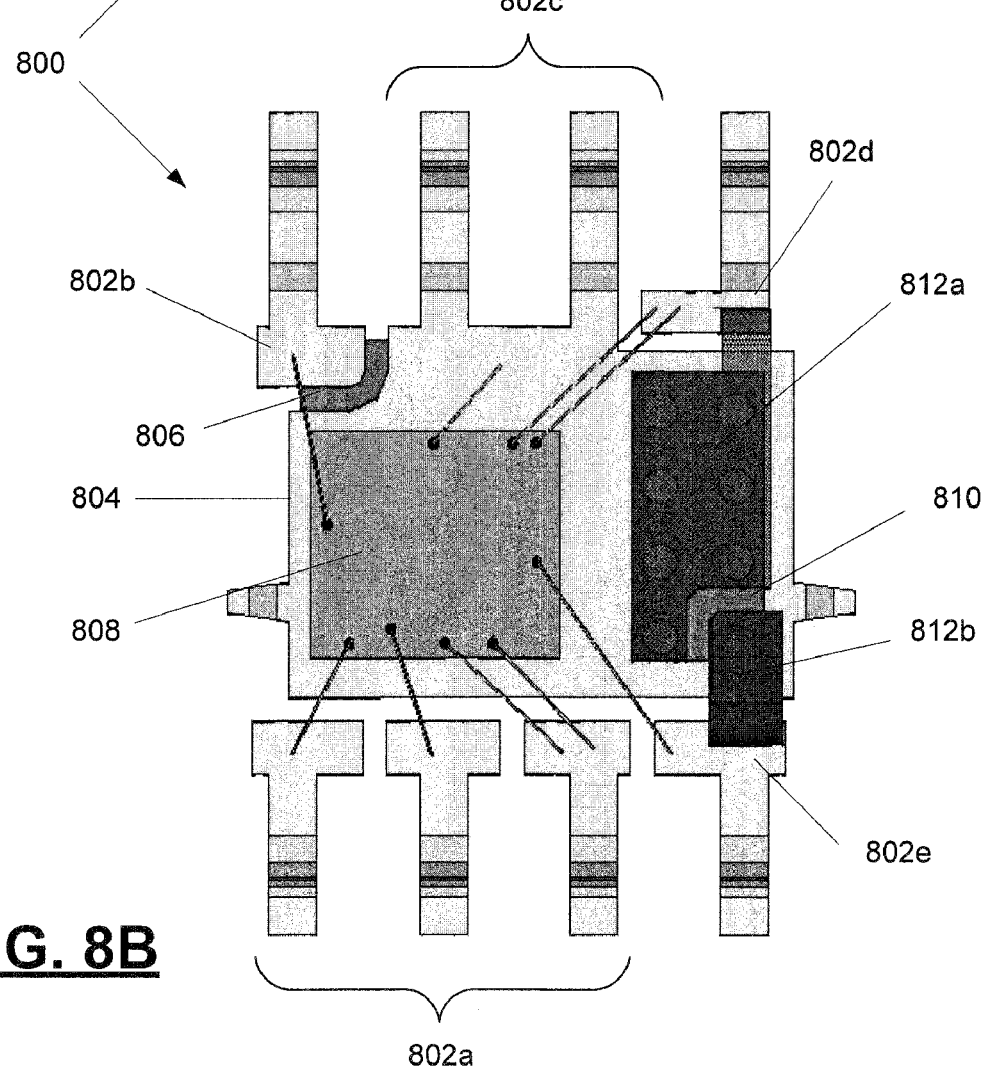
FIG. 8B is a top view of the embodiment shown in FIG. 8A.

As shown in FIG. 8B, controller die 808 is wirebonded to controller leads 802a, high side gate lead 802b, die attach pad 804, low side source lead 802d, and low side gate lead 802e. High side die 806 is configured in substantially the same manner as high side die 606 of FIG. 6. The connection of the low side die 810 of FIG. 8, however, differs from the connection depicted in FIG. 6.

In FIG. 8, the source of low side die 810 is adhesively connected to a first conductive clip 812a. In FIG. 8, conductive clip 812a is transparent to more easily show the adhesive balls used to make the connection. The gate of low side die 810 is adhesively connected to second conductive clip 812b.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A packaged buck converter comprising
a plurality of leads including at least one die attach pad lead, at least one high side gate lead, at least one high side source lead, at least one low side source lead, and at least one controller lead;
a conductive die attach pad electrically connected to the die attach pad lead, wherein the die attach pad has a first surface and a second surface opposite the first surface;
a low side die mounted to the first surface and having a low side gate, a low side source electrically connected to the low side source lead, and a low side drain electrically connected to the die attach pad;
a high side die mounted to the second surface and having a high side source electrically connected to the die attach pad, a high side drain, and a high side gate electrically connected to the high side gate lead;
a controller die mounted to the first surface and electrically connected to the die attach pad, to the controller lead, to the high side gate lead and to the low side gate such that the controller die controls the high side gate and low side gate;
a molding compound enclosing the controller die, the low side die, the die attach pad, a portion of the high side die such that the high side drain is exposed to an external surface of the molding compound, and a portion of the plurality of leads such that the leads extend outside of the molding compound.

2. The buck converter package as recited in claim 1, wherein the plurality of leads includes a low side gate lead wirebonded to the controller die.

3. The buck converter package as recited in claim 1, wherein the low side gate is wirebonded to the controller die.

4. A buck converter package comprising
a plurality of leads including at least one die attach pad lead, at least one high side gate lead, at least one low side source lead, and at least one controller lead;
a conductive die attach pad electrically connected to the die attach pad lead, wherein the die attach pad has a first surface and a second surface opposite the first surface;
a low side die mounted to the first surface and having a low side gate, a low side source electrically connected to the low side source lead, and a low side drain electrically connected to the die attach pad;
a high side die mounted to the second surface and having a high side source electrically connected to the die attach pad, a high side drain, and a high side gate electrically connected to the high side gate lead;
a controller die mounted to the first surface and wirebonded to the die attach pad, wirebonded to the controller lead, wirebonded to the high side gate lead and electrically connected to the low side gate such that the controller die controls the high side gate and low side gate;
a molding compound enclosing the controller die, the low side die, the die attach pad, a portion of the high side die such that the high side drain is exposed to an external surface of the molding compound, and a portion of the plurality of leads such that the leads extend outside of the molding compound.

5. The buck converter package as recited in claim 4, wherein a portion of the high side gate lead, a portion of the die attach pad lead, and the die attach pad are all in a first plane.

6. The buck converter package as recited in claim 5, wherein the plurality of leads includes a low side gate lead, a portion of the low side source lead being in the first plane further comprising
a low side source clip in electrical contact with the low side source and the low side source lead;
a low side gate clip in electrical contact with the low side gate and the low side gate lead,
wherein the low side source clip and the low side gate clip are in a second plane parallel to, but distanced from, the first plane.

7. The buck converter package as recited in claim 5, wherein the plurality of leads further comprises at least one low side gate lead electrically connected to the low side gate, the low side gate lead and low side source lead being in a second plane parallel to, but distanced from, the first plane.

8. The buck converter package as recited in claim 7, wherein the controller die is electrically connected to the low side gate through the low side gate lead and a wirebond.

9. The buck converter package as recited in claim 7, wherein the low side source is electrically connected to the low side source lead through at least one conductive bump.

10. The buck converter package as recited in claim 9, wherein the low side gate is electrically connected to the low side gate lead through at least one conductive bump.

11. The buck converter package as recited in claim 5, wherein the low side source lead is in the first plane and the low side source is wirebonded to the low side source lead.

12. The buck converter package as recited in claim 11, wherein the low side gate is wirebonded to the controller die.

13. A process for forming a buck converter package comprising the steps of
providing a first lead frame with a die attach pad with a first surface and a second surface and plurality of leads including at least one die attach pad lead, at least one high side gate lead, at least one low side source lead, and at least one controller lead, wherein the die attach pad is electrically connected to the die attach pad lead;
mounting a low side die to the first surface, the low side die having a low side drain, source, and gate, such that the low side drain is electrically connected to the die attach pad with a conductive adhesive;
mounting a second lead frame to the low side die such that a low side gate lead of the second lead frame is electrically connected to the low side gate and a low side source lead is electrically connected to the low side source;
mounting a high side die to the second surface, the high side die having a high side drain, source, and gate, such that the high side source is electrically connected to the die attach pad and the high side gate is electrically connected to the high side gate lead;
mounting a controller die to the first surface;
forming electrical connections between the controller die and the die attach pad, the controller lead, the high side gate lead and the low side gate lead such that the controller die controls the high side gate and low side gate;
encasing the controller die, the low side die, the die attach pad, a portion of the high side die, and a portion of the plurality of leads within a molding compound such that the leads extend outside of the molding compound and the high side drain is exposed to an external surface of the molding compound.

14. The process as recited in claim 13, further comprising the step of disposing a plurality of conductive adhesives on the second lead frame prior to the step of mounting the second lead frame, wherein the plurality of low side conductive bumps provide a low side gate bump and a low side source bump.

15. The process as recited in claim 14, further comprising the step of disposing a plurality of high side conductive adhesives on the second surface of the first lead frame prior the step of mounting the high side die, wherein the plurality high side conductive bumps provide a high side gate bump and a high side source bump.

16. The process as recited in claim 15, further comprising the step of singulation cutting the plurality of leads such that the molded compound is no longer bound to the first lead frame.

17. The process as recited in claim 16, further comprising the step of deforming the plurality of leads such that the end of the leads are coplanar with respect to the high side drain.

18. A process for forming a buck converter package comprising the steps of
providing a first lead frame with a die attach pad with a first surface and a second surface and plurality of leads including at least one die attach pad lead, at least one high side gate lead, at least one low side source lead, and at least one controller lead, wherein the die attach pad is electrically connected to the die attach pad lead;
mounting a low side die to the first surface, the low side die having a low side drain, source, and gate, such that the low side drain is electrically connected to the die attach pad with a conductive adhesive;
mounting a high side die to the second surface, the high side die having a high side drain, source, and gate, such that the high side source is electrically connected to the die attach pad and the high side gate is electrically connected to the high side gate lead;
mounting a controller die to the first surface;
forming electrical connections between the controller die and the die attach pad, the controller lead, the high side gate lead and the low side gate such that the controller die controls the high side gate and low side gate;
encasing the controller die, the low side die, the die attach pad, a portion of the high side die, and a portion of the plurality of leads within a molding compound such that the leads extend outside of the molding compound and the high side drain is exposed to an external surface of the molding compound.

* * * * *